(12) United States Patent
Layton

(10) Patent No.: US 6,483,709 B1
(45) Date of Patent: Nov. 19, 2002

(54) CABLE MANAGEMENT SOLUTION FOR RACK MOUNTED COMPUTING COMPONENTS

(75) Inventor: Jeffrey Scott Layton, Round Rock, TX (US)

(73) Assignee: Dell Products L.P., Round Rock, TX (US)

(*) Notice: Subject to any disclaimer, the term of this patent is extended or adjusted under 35 U.S.C. 154(b) by 0 days.

(21) Appl. No.: 09/560,605

(22) Filed: Apr. 28, 2000

(51) Int. Cl.[7] .............................. G06F 1/16; H05K 5/02
(52) U.S. Cl. ..................... 361/724; 361/788; 361/727; 361/686; 439/638
(58) Field of Search ........................ 361/788, 785, 361/790, 724–727, 686; 439/638

(56) References Cited

U.S. PATENT DOCUMENTS

| | | | |
|---|---|---|---|
| 4,899,254 A | | 2/1990 | Ferchau et al. ............. 361/384 |
| 5,348,482 A | | 9/1994 | Rudy, Jr. et al. ............. 439/61 |
| 5,801,921 A | * | 9/1998 | Miller ........................ 361/686 |
| 5,903,698 A | | 5/1999 | Poremba et al. ........... 385/135 |
| 6,016,252 A | | 1/2000 | Pignolet et al. ............. 361/724 |
| 6,038,126 A | * | 3/2000 | Weng ......................... 361/679 |
| 6,201,692 B1 | * | 3/2001 | Gamble et al. ............. 361/685 |
| 6,297,962 B1 | * | 10/2001 | Johnson et al. ............. 361/726 |
| 6,336,691 B1 | * | 1/2002 | Maroney et al. ............ 312/236 |
| 6,351,375 B1 | * | 2/2002 | Hseih et al. ................ 361/685 |

OTHER PUBLICATIONS

Pending U.S. patent application Ser. No. 09/237,745 entitled "Dual–Purpose Backplane Design for Multiple Types of Hard Disks" by Jenwei et al: Dell U.S.A., L.P. (DC–01641), Filed Jan. 26, 1999.

Pending U.S. patent application Ser. No. 09/474,202 entitled "System for Managing Cables for A Rack–Mounted Computer System" by Jensen, et al.: Dell U.S.A., L.P. (DC–02026), Filed Dec. 29, 1999.

Pending U.S. patent application Ser. No. 09/181,289 entitled "Multi–Segment Nesting, Low Profile Cable Management Arm" by Beall, et al.: Dell U.S.A., L.P. (DC–01579), File Oct. 28, 1998.

Pending U.S. patent application Ser. No. 08/837,181 entitled "Intelligent Backplane for Serial Storage Architectures" by Jeffries, et al.: Dell U.S.A.; L.P. (DC–01083), Filed Apr. 11, 1987.

Pending U.S. patent application Ser. No. 09/470,280 entitled "Connector Arrangement and Connecting Method for Cable Mangement Arms" by Gaunter, et al.: Dell U.S.A., L.P.(DC–02095), Filed Dec. 22, 1999.

* cited by examiner

Primary Examiner—Lynn D. Feild
(74) Attorney, Agent, or Firm—Baker Botts L.L.P.

(57) ABSTRACT

The present disclosure provides a cable management solution for rack mounted computing components. In one embodiment, a backplate is preferably fixedly coupled to a rack structure. One face of the backplate is preferably operable to maintain connection with the preferred operating cables, such as, I/O devices, network, etc., which would typically couple directly to the computing component. On an opposite face of the backplate, is at least one plug operable to couple the various cable connections maintained by the backplate to at least one jack on the computing component engaged therewith. A series of alignment posts and alignment slots enable a computing component to be easily slid into and out of the rack as well as simplify engagement with and disengagement from the plug or plugs on the backplate.

23 Claims, 6 Drawing Sheets

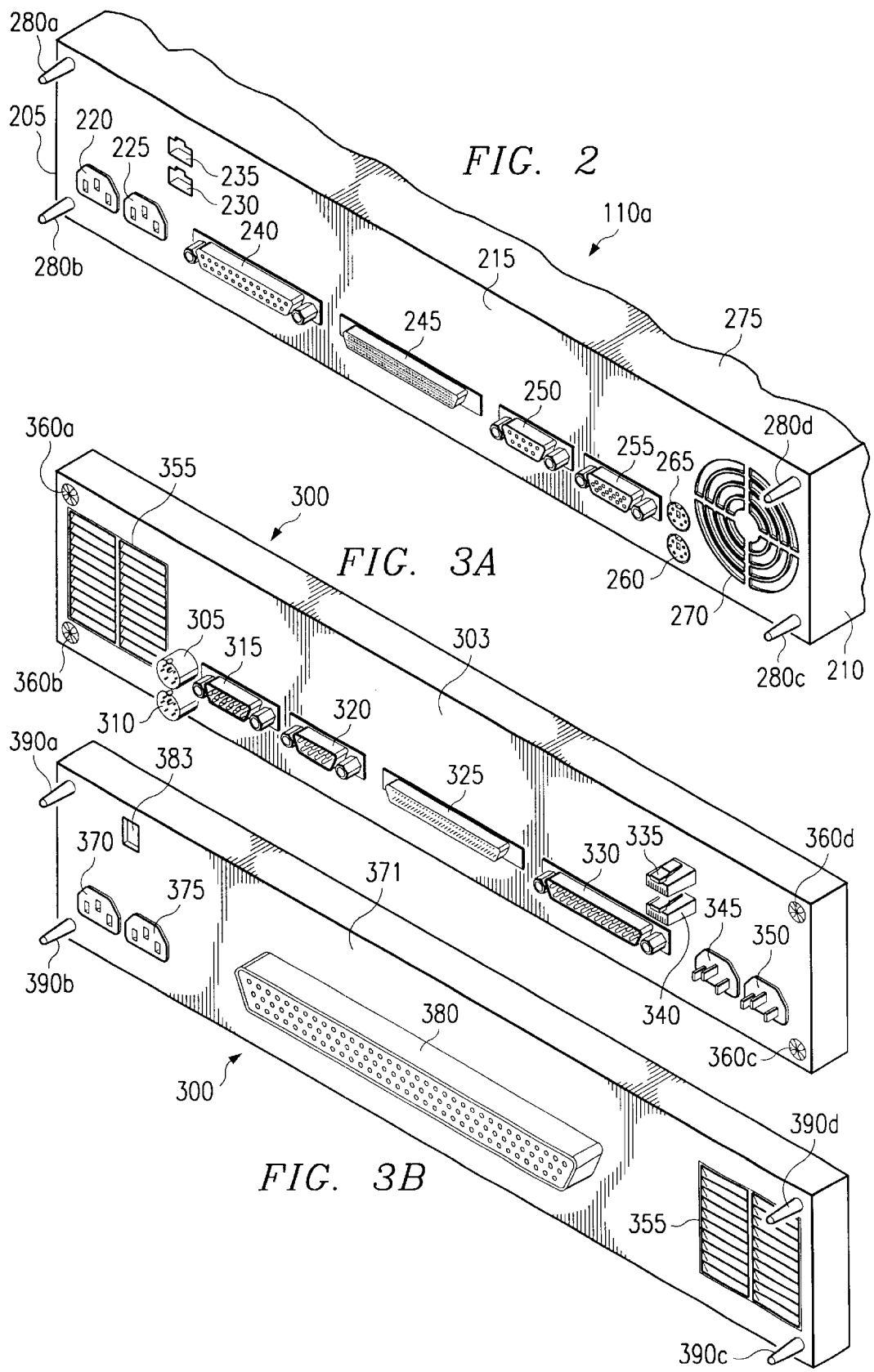

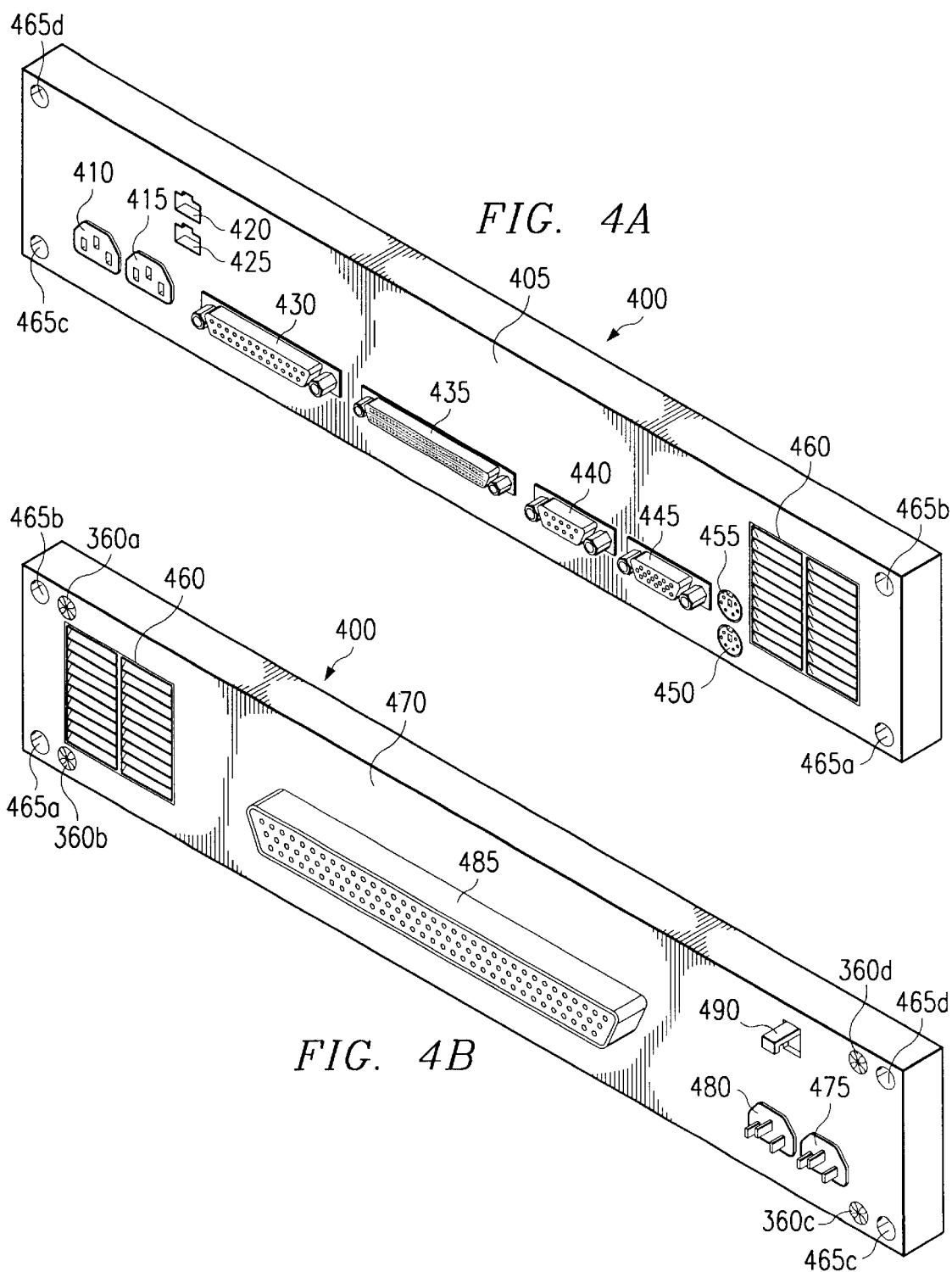

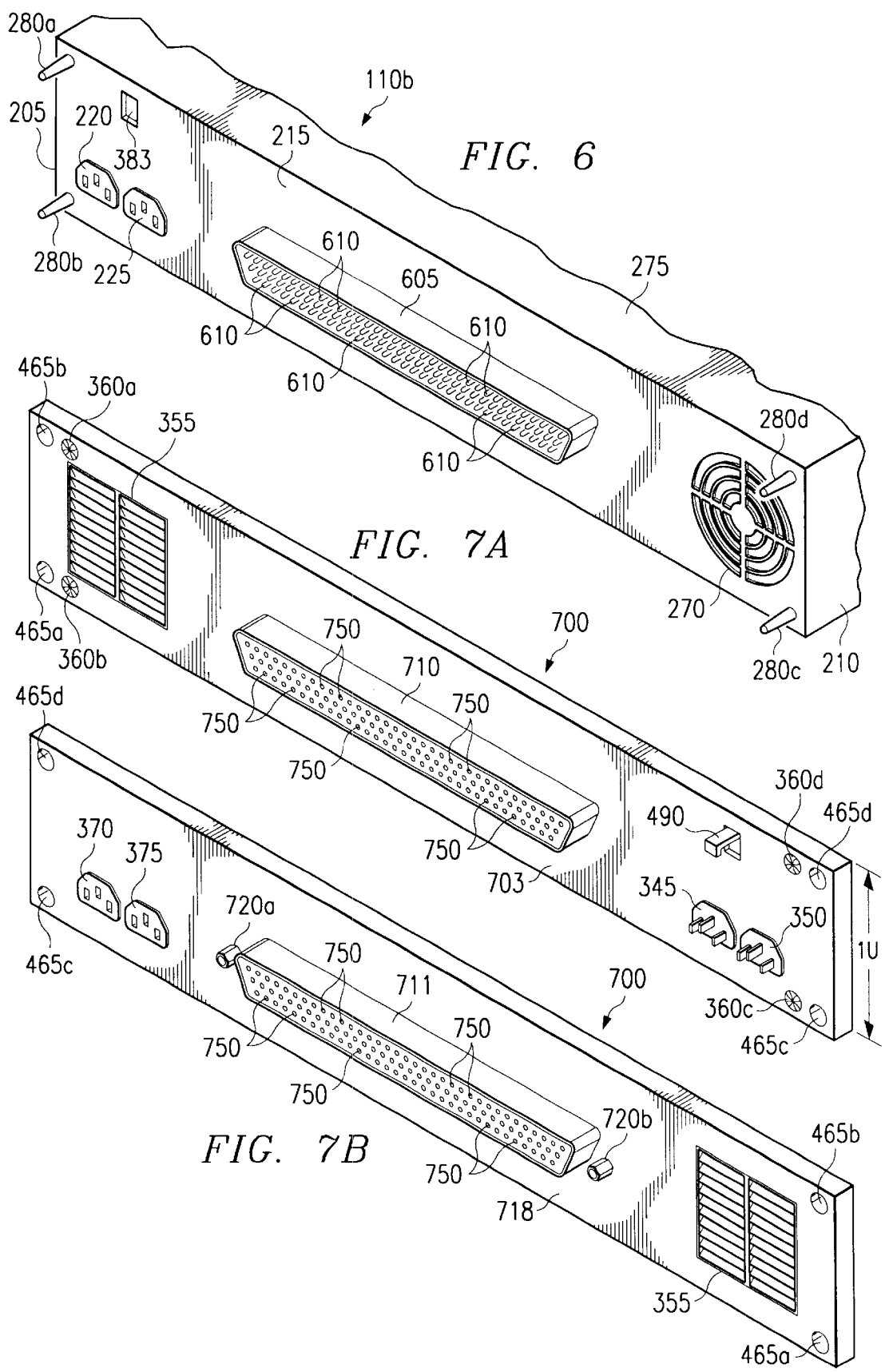

CABLE MANAGEMENT SOLUTION FOR RACK MOUNTED COMPUTING COMPONENTS

TECHNICAL FIELD

The present disclosure relates generally to cable management. More particularly, the present disclosure relates to a cable management solution for rack mounted computing components.

BACKGROUND

As rack mounted servers become more and more dense, an increasing number of servers can be mounted into an industry standard 42U rack where each "U" is generally equivalent to 1.75 inches of rack height. With some server systems intended for the internet service provider (ISP) market, 1U tall servers are becoming commonplace. Theoretically, the existence of 1U servers will allow up to 42 (forty-two) individual servers to be mounted into a single 42U rack. With each server typically requiring several cables, cable management becomes one of the largest roadblocks to such dense server system installations.

Conventional cable management techniques have included taking each of the cables connected to each respective port on the rear of a server and securing the cables to a folding cable management arm. The cable management arm is typically attached to both the back of the server and the back of the rack. This arrangement allows for a cable service loop of sufficient length such that the server can be slid out of the front portion of the rack on its rails for service. This method of cable management was developed when servers were much less dense and is becoming more difficult to implement as rack mounted components continue to shrink in height and racks become more crowded and dense.

As server installations become more dense, the individual servers take on more of a utilitarian or appliance role. In these dense configurations, no one server is the only server performing any given function. In reality, each of a plurality of servers is performing the same function, similar to the redundant server configurations seen in server farms and clusters. However, new, low-end applications, such as Internet Caching, Web Hosting, Firewalls, etc., are becoming more popular.

Having multiple redundant servers dramatically reduces the importance of 24 hour, 7 day availability per server and elevates the importance of 24 hour, 7 day a week availability of the data-center itself. As such, the service requirements of the individual servers can be handled at the depot level rather than on-site as in the past. Depot level service programs can reduce the cost of servers by reducing the need for hot-plug and redundant components such as fans, hard drives, and power supplies. Hot-plug and redundant components often only add unnecessary costs to a unit whose availability needs are handled by a number of similar units in the data-center rather than the individual unit itself. In addition, because the individual server no longer needs to be serviced while it is operational, simple rack guides can be substituted for more elaborate bearing and slide mechanisms to save cost, thereby further signifying the shift in service strategy for this new class of servers.

SUMMARY

In accordance with teachings of the present disclosure, a computing system having one or more rack mounted components is provided. The computing system may include one or more computing components having a housing operable to maintain at least one processor and memory as well as other devices. A rack structure is also provided with guides disposed therein, and wherein the guides are operable to engage respective sides of the housing such that the computing component may be easily disposed within and displaced from the rack structure. To provide simplified removal and reinsertion of the computing component into and out of the rack structure, a backplate is preferably coupled to a rear opening of the rack structure. The backplate preferably includes at least one data plug that is operable to couple to at least one data jack on a rear face of the computing component. The backplate also preferably includes at least one data port that is operable to couple to at least one data cable.

The present disclosure includes a computing component having at least one processor, memory operably associated with the processor, and a housing operable to maintain the memory and the processor. First and second sides of the housing are preferably operable to engage a pair of guides disposed within a rack structure such that the housing may slide into and out of an opening of the rack structure. A rear face of the housing preferably includes at least one jack that is operable to couple to a plug on a backplate which may be disposed proximate the rear opening of the rack structure.

Further provided by the present disclosure is a backplate having at least one data port that is preferably operable to receive a data cable. Also preferably included on the backplate is at least one data plug that is operably coupled to the data port. The data plug is also preferably operable to couple to a data jack on a rack mountable computing component such that the data cable coupled to the data port is operably coupled to the rack mountable computing component.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIG. 2 is a schematic drawing showing an isometric view with portions broken away of a rear portion of a 1U computing component incorporating teachings of the present disclosure;

FIGS. 3A–3B illustrate perspective views of a first and second face of one embodiment of an interposer board incorporating teachings of the present disclosure;

FIGS. 4A–4B illustrate perspective views of a first and second face of one embodiment of a backplate according to teachings of the present disclosure;

FIG. 6 is a schematic drawing showing an isometric view with portions broken away of a rear portion of another embodiment of a 1U computing component incorporating teachings of the present disclosure;

FIGS. 7A–7B illustrate perspective views of a first and second face of an alternate embodiment of a backplate incorporating teachings of the present disclosure;

DETAILED DESCRIPTION

Preferred embodiments and their advantages are best understood by reference to FIGS. 1–9, wherein like numbers are used to indicate like and corresponding parts.

Figure 1:
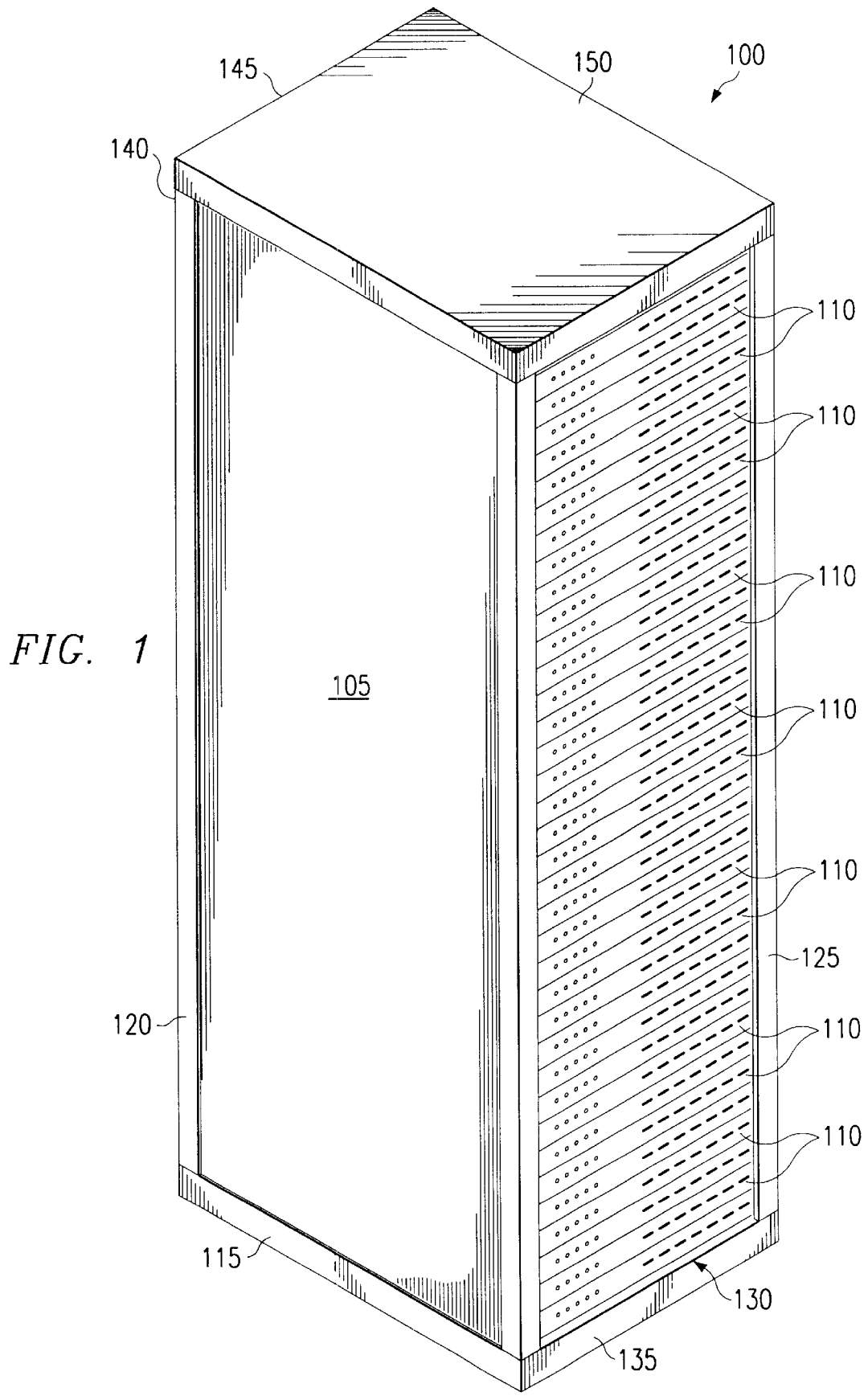
FIG. 1 illustrates a perspective view of a computer system and associated rack structure incorporating teachings of the present disclosure.

Referring first to FIG. 1, a perspective view of a computer system and associated rack structure incorporating teachings of the present disclosure is illustrated. Computer system 100 represents one configuration for a computing component 110 and a rack structure 105 incorporating teachings of the present disclosure. Computer system 100 may be employed in a computing center such as those used by an internet service providers (ISP) or in any other computer hardware intensive environment. Computer system 100 preferably includes 42U rack structure 105 and forty two (42) 1U computing components 110 slidably disposed therein. Computing components 110 may be any rack mountable computing component such as a server, a network hub, a storage device, an uninterruptible power supply, etc.

Rack structure 105 preferably stands upright on base 115 and may be adjoined or positioned next to other rack structures 105 at either first side 120 or second side 125. In one embodiment of rack structure 105, computing components 110 may be removed from rack structure 105 through front opening 130 on front portion 135 of rack structure 105. Cabling is preferably connected to each computing component 110 through rear opening 140 at rear portion 145 of rack structure 105. Examples of such cabling will be discussed later in greater detail. In another embodiment of rack structure 105, cabling, such as network cabling, power cabling, data cabling, peripheral cabling, etc., may be integrated into rack structure 105 entering through top 150 and/or through base 115.

Figure 9:
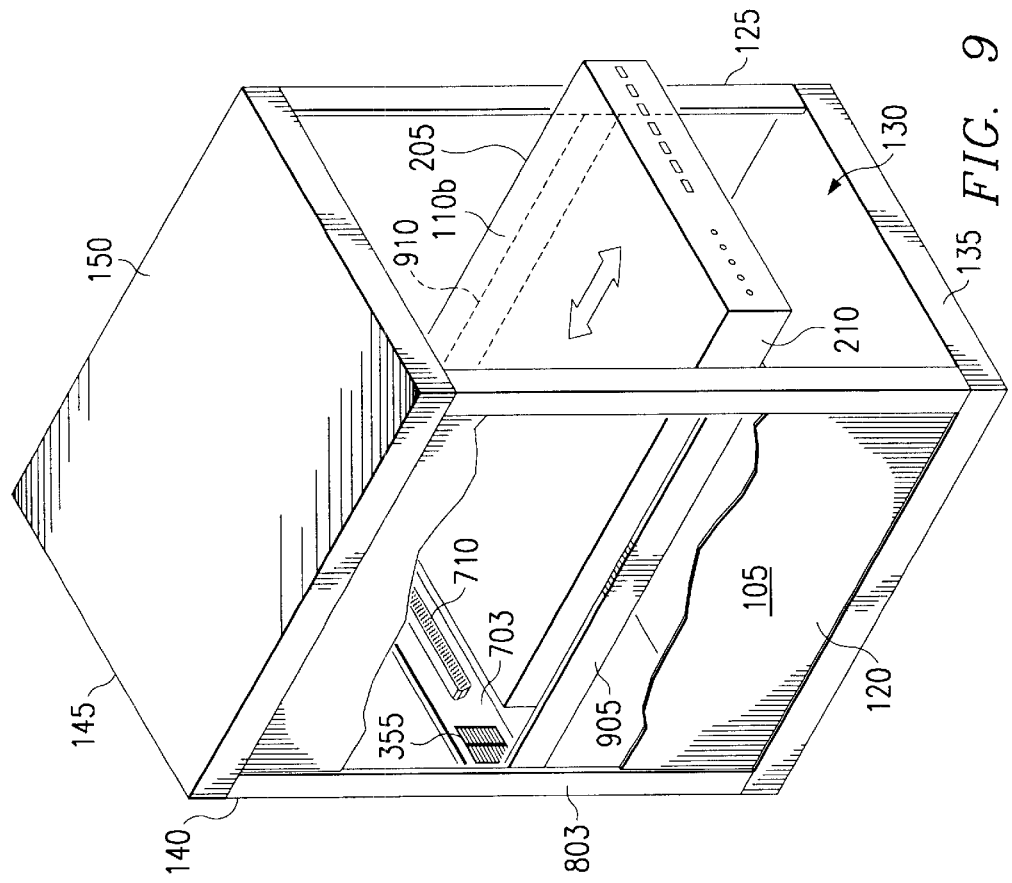
FIG. 9 is a schematic drawing showing an isometric view with portions broken away of a computer system having a rack structure, a server, an interposer board and a backplate incorporating teachings of the present disclosure.

Referring now to FIG. 2, a schematic drawing showing an isometric view with portions broken away of a rear portion of a 1U computing component 110a incorporating teachings of the present disclosure is illustrated. For purposes of illustrating various features of the present disclosure, computing component 110a may be described as a server mounted into rack structure 105 of FIG. 1. First side 205 and second side 210 of computing component 110a are preferably configured to engage respective guides (such as shown in FIG. 9) disposed inside rack structure 105. Once engaged, computing component 110a may be displaced in either a front 135 to rear 145 or rear 145 to front 135 manner within rack structure 105. Such displacement is desirable in scenarios where computing component 110a is being replaced, serviced or otherwise maintained.

Preferably coupled to rear face 215 of computing component 110a is an illustrative assortment of jacks commonly found on servers as well as a series of accessories according to teachings of the present disclosure. Computing component 110a is preferably configured with first 220 and second 225 female power jacks, computing component 110a may be configured with only one power port 220 or 225 in one embodiment, first 230 and second 235 network jacks, parallel jack 240, SCSI (Small Computing System Interface) jack 245, serial jack 250, video jack 255, keyboard jack 260 and mouse jack 265. The assortment of jacks present on rear face 215 of computing component 110a allows computing component 110a to perform various data processing responsibilities in a data-center. It is within the scope of the present disclosure to have a variety of additional or substitutional jacks operably coupled to rear face 215 of computing component 110a. Additional jacks (not expressly shown), such as USB (Universal Serial Bus) jacks, Fire Wire jacks, audio/video (A/V) jacks, as well as a variety of other jacks which may be used with computing component 110a, are considered within the scope of the present disclosure'S teachings.

Also preferably coupled to rear face 215 of computing component 110a is fan grating 270. Fan grating 270 allows air to be removed from or directed into housing 275 of computing component 110a by a fan (not expressly shown) mounted inside housing 275 of computing component 110a such that internal components including processors, memory, etc., may be cooled.

A series of alignment posts 280a–280d are also preferably included on rear face 215 of computing component 110a. Alignment posts 280a–280d are preferably configured to align with and engage respective alignment slots on an interposer board (such as shown in FIG. 3A) so that computing component 110a may be operably coupled therewith and employed as described in further detail below. The specific design or placement of alignment posts 280a–280d is not limited to that illustrated. Accordingly, it is within the scope of the present disclosure to use a variety of different alignment posts in a variety of different locations.

Referring now to FIGS. 3A–3B, perspective views of one embodiment of an interposer board incorporating teachings of the present disclosure are illustrated. Interposer board 300 may be made from a variety of different materials. The material chosen to make interposer board 300 is preferably rigid enough to function according to teachings of the present disclosure, i.e., support desired cabling, engage a backplate (discussed and illustrated below), etc. According to teachings of the present disclosure, interposer board 300 may be employed as an adapter, converter or jack for conventional computing components 110 which have been modified, similar to computing component 110a, to allow them to be used with the backplate teachings of the present disclosure. The preferred use of interposer board 300 will be discussed in great detail below with respect to FIG. 5.

Specifically in FIG. 3A, first face 303 of interposer board 300 is preferably configured with mouse port 305, keyboard port 310, video port 315, serial port 320, SCSI port 325, parallel port 330, first 335 and second 340 network ports as well as first 345 and second 350 male power ports. Fan grating 355 preferably provides an air pathway through interposer board 300 to allow a fan (not expressly shown) contained within housing 275 of computing component 110a to circulate air with respect to any internal components, i.e., processor, memory, etc., contained therein.

Also preferably included on first face 303 of interposer board 300 are alignment slots 360a–360d. Alignment slots 360a–360d are configured to receive and engage respective alignment posts 280a–280d on rear face 215 of computing component 110a. The mating of alignment posts 280a–280d with alignment slots 360a–360d may also be configured such that component 110a is held in a generally fixed spatial relation to interposer board 300. In another embodiment, it is possible to attach interposer board 300 to an adapter tray (not expressly shown) configured to receive and engage computing component 110a and rack structure 105.

Specifically in FIG. 3B, second face 371 of interposer board 300 is preferably configured with alignment posts 390a–390d, first 370 and second 375 female power jacks as well as multi-function data jack 380. According to teachings of the present disclosure, multi-function data jack 380 is preferably operable to receive and transmit data that would normally be received by the individual jacks on rear face 215 of computing component 110a as illustrated in FIG. 2. Accordingly, multifunction data jack 380 is preferably electrically and/or communicatively coupled to one or more ports or face 303 such that data jack 380 is capable of receiving and transmitting data for each device connected to first face 303 or, similarly, each device which would typically be connected to rear face 215 of computing component 110a. In an alternate embodiment, first 370 and second 375 female power jacks may be integrated into multi-function data jack 380.

As will be discussed in greater detail below, second face 371 of interposer board 300 is preferably configured such that the first face of a backplate (such as shown in FIG. 4A) may be mated therewith. Lock aperture 383 is preferably included on interposer board 300 such that a locking mechanism on the backplate of the present disclosure may engage interposer board 300. The locking mechanism and backplate will be discussed further below.

Figure 5:
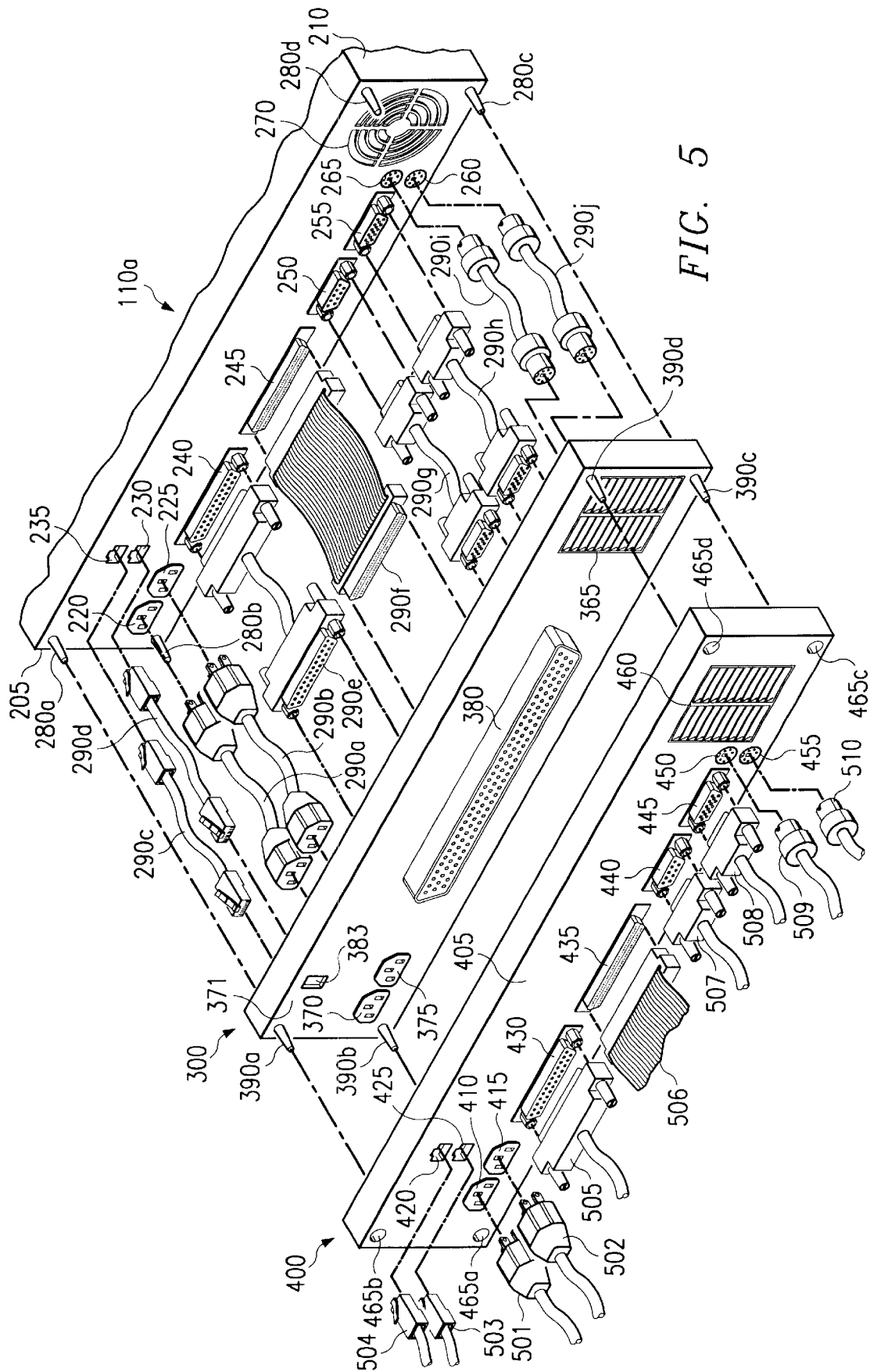
FIG. 5 is a schematic drawing showing an exploded view of an alternate embodiment of a 1U computing component incorporating teachings of the present disclosure.

Referring now to FIGS. 4A–4B, perspective views of one embodiment of a backplate incorporating teachings of the present disclosure are illustrated. As illustrated, backplate 400 is configured, on second face 405, in a manner similar to that of rear face 215 on computing component 110a. Accordingly, backplate 400 is preferably configured with a series of ports operable to couple cabling (such as shown in FIG. 5), which would typically couple directly to one or more jacks on rear face 215 of computing component 110a. Second face 405 of backplate 400 preferably includes first 410 and second 415 female power ports, first 420 and second 425 network ports, parallel port 430, SCSI port 435, serial port 440, video port 445, keyboard connector 450 and mouse connector 455.

Figure 8:
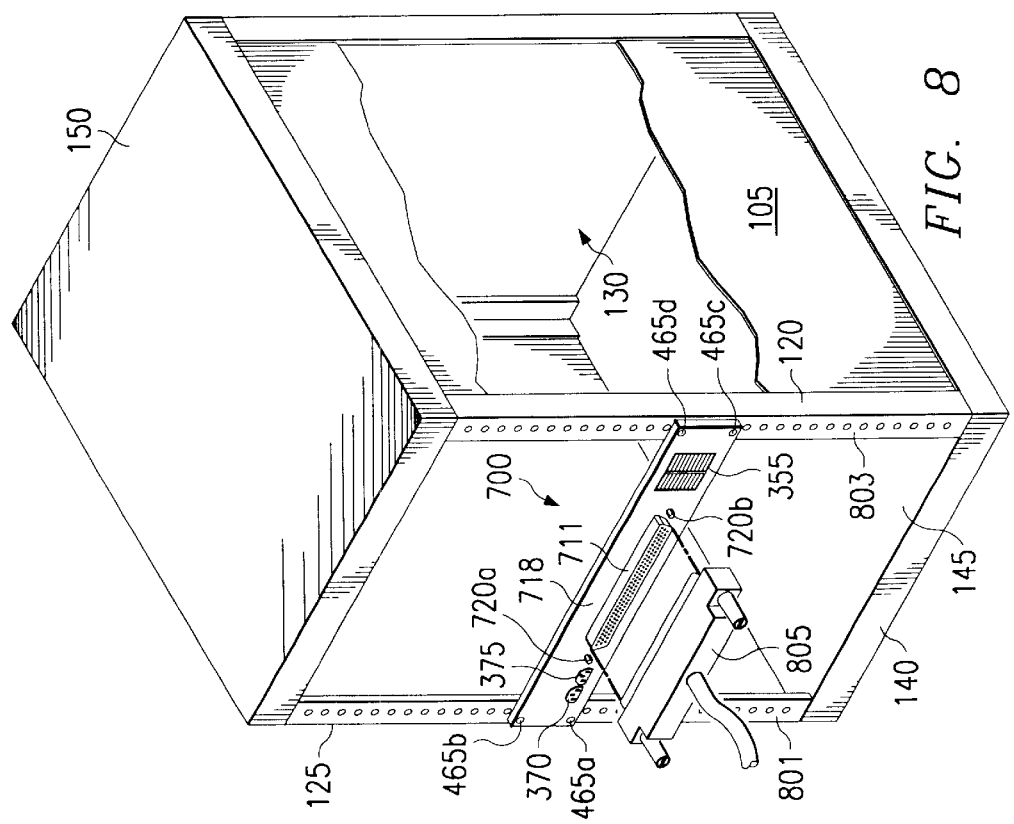
FIG. 8 is a schematic drawing showing an isometric view with portions broken away of the rear portion of a rack structure containing a computing component incorporating teachings of the present disclosure.

Also preferably present on backplate 400 is air grating 460 and a series of rack mount apertures 465a–465d, each of which pass completely through backplate 400. Rack mount apertures 465a–465d may be used to couple backplate 400 to a vertical rail (such as shown in FIG. 8) located at rear 145 of rack structure 105.

First face 470 of backplate 400, as illustrated in FIG. 4B, is preferably configured to communicatively and electrically mate with face 371 of interposer board 300 illustrated in FIG. 3B. More specifically, multi-function data plug 485 is preferably configured to communicatively engage multi-function data jack 380. In addition, alignment slots 360a–360d on backplate 400 are preferably configured to receive and engage alignment posts 390a–390d on interposer board 300 such that, once engaged, data jack 380 and data plug 485 may be safely and effectively coupled without a direct line of sight. As mentioned above, alignment posts 280a–280d or 390a–390d are not limited to the design or placement illustrated. The design and placement of alignment posts as well as respective alignment slots may be dictated by the size, configuration, jacks, etc., on the computing component being employed.

In order to operably couple with interposer board 300, first face 470 of backplate 400 preferably contains first 475 and second 480 male power plugs. First 475 and second 480 male power plugs are preferably configured to couple at least one power supply (not expressly shown), such as a wall outlet, a power bussbar integrated into rack structure 105, a surge protector power source, a UPS, or other capable power source coupled, to first 410 and/or second 415 female power port and subsequently to computing component 110a through respective power connections on interposer board 300. In one embodiment of backplate 400, first 475 and/or second 480 male power plugs may be integrated into data plug 485.

To prevent interposer board 300, or computing component 110a, from being disengaged from backplate 400 while receiving power, locking mechanism 490 is preferably included on face 470 of backplate 400. Locking mechanism 490 engages lock aperture 383 on interposer board 300 while power is being provided to computing component 110a through backplate 400. When power is disconnected or turned off, locking mechanism 490 is preferably configured to disengage lock aperture 383. The present disclosure includes the use of mechanical locking mechanisms, electrical/solenoid locking mechanisms as well as other embodiments of locking mechanism 490 which are within the scope of the present disclosure.

To enable data communications to be received by and transmitted from computing component 110a through interposer board 300, multi-function data plug 485 is preferably included on first face 470 of backplate 400. Similar to multi-function data jack 380 on interposer board 300, multi-function data plug 485 is operable to connect each of the individual data ports present on. second face 405 of backplate 400 to computing component 110a via data jack 380 and respective ports included on interposer board 300.

Referring now to FIG. 5, a schematic drawing showing an exploded view of the assembly of computing component 110a with interposer board 300 and backplate 400 is illustrated. The use of computing components 110, configured generally as computing component 110a, with a backplate 400 incorporating teaching of the present disclosure presents a somewhat complex assembly scenario. As illustrated, for computing component 110a to be used with a backplate 400 incorporating teachings of the present disclosure, interposer board 300 is preferably employed to simplify the removal from and reattachment to such a backplate 400.

First, to enable computing component 110a to be operably coupled to interposer board 300, a series of patch cables 290a–290j are preferably employed to couple computing component 110a to interposer board 300. Patch cables 290a–290b are used to couple female power jacks 220 and 225 to male power ports 345 and 350 on interposer board 300. Patch cables 290c–290d are used to couple network jacks 230 and 235 to network ports 335 and 340 on interposer board 300. Patch cable 290e is used to couple parallel jack 240 to parallel port 330 on interposer board 300. SCSI jack 245 is coupled to SCSI port 325 on interposer board 300 via patch cable 290f. Patch cables 290g and 290h are used to couple serial and video jacks 250 and 255 to serial and video ports 315 and 320 on interposer board 300. Keyboard and mouse jacks 260 and 265 are coupled to keyboard and mouse ports 305 and 310 on interposer board 300 via patch cables 290i and 290j. Computing component 110a may be configured to engage interposer board 300 when alignment posts 280a–280d engage alignment slots 360a–360d such that computing component 110a and interposer board 300 become a fixed, functional unit. In an alternate embodiment, the connections implemented by "pigtail" or patch cables 290a–290j may be implemented in a printed circuit board (PCB) (not expressly shown). Functioning in much the same manner as patch cables 290a–290j, the PCB would likewise operably couple the assorted jacks on a computing component to their respective ports on an interposer board such as interposer board 300.

Once computing component 110*a* and interposer board 300 are operably and, preferably, fixedly coupled together such that they function as one unit, it is possible to employ backplate 400 according to teachings of the present disclosure. Accordingly, computing component 110*a* and interposer board 300 can be attached to and removed from backplate 400 using alignment posts 390*a*–390*d* of interposer board 300 to couple with respective alignment slots 360*a*–360*d* on backplate 400. Similarly, female power jacks 370 and 375 are preferably configured to engage with and disengage from male power plugs 475 and 480 on backplate 400. As mentioned above, locking mechanism 490 is configured to engage lock aperture 383 when computing component 110*a* is receiving power through backplate 400.

According to one embodiment, data jack 380 and data plug 485 are designed from a "blind-mate" plug and jack combination. As such, a direct line of sight is not required to align data jack 380 and data plug 485 such that they properly mate when coupled. This ability further simplifies removing and reinserting computing components 110 out of and into rack structure 105 as well as reduces the likelihood of plug or jack damage. Although the illustrations of the present disclosure include primarily blind-mate "D-type" cable and plug/jack connections, it is possible to implement other connection forms, i.e., the plug/jack connections may employ a blind-mate card and slot type connection similar to that used on computer motherboards and expansion cards.

When backplate 400 is attached to rack structure 105 using rack mount apertures 465*a*–465*d*, the connections which would typically be directly connected to respective jacks on rear face 215 of computing component 110*a*, i.e., power cables 501 and 502 and for data cables 503–510, remain attached to their respective ports on face 405 of backplate 400. These connections allow data plug 485 to communicate data to and from computing component 110*a* through interposer board 300 and its associated data jack 380 and various data port connections.

Referring now to FIG. 6, a schematic drawing showing an isometric view with portions broken away of one embodiment of a 1U computing component incorporating teachings of the present disclosure is illustrated. Computing component 110*b* of FIG. 6 preferably functions in generally the same manner as previously described computing components 110 or 110*a*, i.e., as a server. As illustrated, rear face 215 of computing component 110*b* has first 220 and second 225 female power jacks, fan grating 270, lock aperture 383 and alignment posts 280*a*–280*d*. Similar to computing component 110*a*, computing component 110*b* is contained within housing 275 which is mountable in rack structure 105 using sides 205 and 210 to engage respective guides (such as shown in FIG. 9) maintained within rack structure 105. One embodiment of computing component 110*b* may have only one power jack 220 or 225 thereon. Additionally, one embodiment of computing component 110*b* may integrate power jacks 220 and/or 225 into data jack 605.

Also included on rear face 215 of computing component 110*b* is data jack 605. According to teachings of the present disclosure, data jack 605 may be a multifunction jack. For example, if computing component 110*b* is a server, data jack 605 would preferably serve as the connection point for all data into and out of computing component 110*b*. Specifically, data jack 605 would preferably be the connection point for any video data, serial data, parallel data, SCSI data, keyboard data, mouse data, network data, etc., being received by or transmitted from computing component 110*b*. Accordingly, data jack 605 would need to have pin connections for a video peripheral, serial peripherals, I/O peripherals, network peripherals, storage peripherals, etc. Similar to multi-function data jack 380 and multi-function data plug 485, if computing component 110*b* was configured with the same general capabilities as computing component 110*a*, data jack 605 would likely receive input on approximately 145 (one hundred forty five) pins 610. The need for 102 (one hundred and two) pins 610 stems from the presence of one 68 (sixty eight) pin SCSI connection, one 25 (twenty five) pin parallel connection, one 9 (nine) pin serial connection, one 15 (fifteen) pin video connection, one 6 (six) pin mouse connection, one 6 pin keyboard connection, and two 8 (eight) pin network connections, as illustrated on computing component 110*a* of FIG. 2. As previously mentioned, many different combinations of peripherals and, therefore, jacks may be employed on computing component 110*a*. Accordingly, the number, configuration, layout, etc., of pins for a computing component incorporating teachings of the present disclosure is not limited to the 145 (one hundred forty five) pin example discussed above.

Referring now to FIGS. 7A–7B, perspective views of an alternate embodiment of a backplate incorporating teachings of the present disclosure are illustrated. Backplate 700 is preferably made from a material similar to that of interposer board 300 and backplate 400. Backplate 700 is designed to function with computing component 110*b* in a similar manner to the way in which backplate 400 functions with computing component 110*a*.

Specifically in FIG. 7A, first face 703 of backplate 700 is preferably configured with rack mount apertures 465*a*–465*d* which are operable to allow backplate 700 to be fixedly attached to rack structure 105. Alignment slots 360*a*–360*d* are also preferably included on first face 703 of backplate 700 to allow computing component 110*b* to be properly coupled to and aligned with backplate 700 once alignment slots 360*a*–360*d* engage alignment posts 280*a*–280*d*. Similar to FIGS. 3A and 4B, first 345 and second 350 male power plugs are preferably connected to first face 703 of backplate 700 such that at least one power supply (not expressly shown) may be coupled to computing component 110*b*. Fan grating 355 and locking mechanism 490 are also preferably present on backplate 700. Data plug 710, similar in form and function to data plug 485, is also preferably coupled to first face 703 of backplate 700 such that any data cabling (such as shown in FIG. 8) attached to backplate 700 is subsequently connected to computing component 110*b*.

Illustrated in FIG. 7B, is second face 718 of backplate 700. Preferably coupled to second face 718 are first 370 and second 375 female power ports that are preferably operable to receive power from at least one power supply (not expressly shown). Screw attachments 720*a* and 720*b* are preferably included such that a data cable (such as shown in FIG. 8) may be fixedly attached to data port 711. One embodiment of backplate 700 may integrate first 345 and/or second 350 power plugs as well as first 370 and second 375 power ports into data plug 710 and data port 711 respectively.

In the computing component 110*b* embodiment illustrated in FIG. 6 and the backplate 700 embodiment illustrated in FIG. 7, the traditional cabling, as illustrated in FIG. 5, used in association with a computing component 110 has been integrated (not expressly shown) into rack structure 105. This integration results in a single data cable (such as shown in FIG. 8) having the appropriate connections such that a mouse, keyboard, network, monitor, storage, etc., may be properly coupled to computing component 110*b*. Accordingly, apertures 750 function to communicatively couple pins 610 on computing component 110*b* to pins (not expressly shown) included on the single data cable (such as shown in FIG. 8) which is operably coupled to data port 711 during normal operation.

Referring now to FIG. 8, a perspective view of a rack structure incorporating one embodiment of a backplate according to teachings of the present disclosure is illustrated. As illustrated in FIG. 8, backplate 700 is preferably attached to vertical rails 801 and 803 of rack structure 105 using rack mount apertures 465a–465d. As a result of being fixedly held in place, backplate 700 may receive computing component 110b as it is inserted in rack structure 105 through front opening 130. As computing component 110b is displaced towards backplate 700, alignment posts 280a–280d on computing component 110b engage alignment slots 360a–360d on backplate 700. This method of coupling computing component 110b to backplate 700 allows computing component 110b to be easily removed from and reattached to data cabling 805 which is fixedly coupled to data port 711 and used by computing component 110b to perform various operating functions in a data-center.

Referring now to FIG. 9, a perspective view with portions cut away of rack structure 105 and computing component 110b incorporating teachings of the present disclosure is illustrated. The ease of removal from and reattachment to backplate 700 of computing component 110b is illustrated in FIG. 9. According to the present disclosure, guides 905 and 910 allow computing component 110b to be displaced with respect to backplate 700. Guides 905 and 910 can be configured similar to angle-iron in one embodiment or as a ball-bearing and slide combination which attaches to sides 205 and 210 of housing 275 in another embodiment. As the convenience and need for depot-level service of computing components 110 becomes more prevalent, the benefits taught by the present disclosure will become more evident.

Similar to the concept of integrating multiple data cables into single data 805 of FIG. 8, teachings of the present disclosure may be incorporated into a single backplate (not expressly shown) that is operable to couple to a plurality of computing components 110. Such a backplate may cover a majority of rear opening 140 of rack structure 105 as well as have a plurality of connections operable to receive the plurality of computing components 110 thereon. To implement a backplate operable to provide connections for a plurality of computing components, it may be preferable to manage cable connections at the rack level. Rack level management would preferably allow each data plug and data port of the backplate to be "re-wired" for the cable connections preferred by the computing component 110 which is attached thereto.

Although the disclosed embodiments have been described in detail, it should be understood that various changes, substitutions and alterations can be made to the embodiments without departing from their spirit and scope. For example, the embodiment disclosed herein refers primarily to a 42U rack employing 1U servers. It is within the scope of the present disclosure to use a 24U rack or any other size rack operable to maintain computing components therein. Likewise, servers, storage devices, routers, hubs, UPS, etc., of sizes both smaller and larger than 1U may benefit teachings of the present disclosure.

What is claimed is:

1. A computing system comprising:
a computing component having a housing;
a rack structure operable to releasably maintain at least one computing component therein;
respective first and second guides operably coupled to respective first and second sides of the rack structure;
the guides operable to engage respective first and second sides of the housing such that the computing component may be displaced with respect to a front opening of the rack structure;
a backplate having respective first and second faces;
the backplate operably coupled to a rear opening of the rack structure;
at least one data plug operably coupled to the first face of the backplate;
the data plug operable to couple to at least one data jack on a rear face of the computing component;
at least one data port operably coupled to the second face of the backplate; and
the data port operable to couple to at least one data cable.

2. The computing system of claim 1 further comprising:
at least one power plug operably coupled to the first face of the backplate; and
the power plug operable to couple at least one power supply to at least one power jack operably coupled to the rear face of the computing component.

3. The computing system of claim 1 further comprising:
an interposer board operably coupled between the computing component and the backplate; and
the interposer board operable to couple the at least one data jack to the at least one data plug.

4. The computing system of claim 1 further comprising the housing having a proximate height of 1U.

5. The computing system of claim 1 further comprising:
at least one alignment mechanism operably coupled to the computing component; and
the at least one alignment mechanism operable to engage the first face of the backplate such that the data plug and the data jack may be operably coupled.

6. The computing system of claim 1 further comprising:
at least one locking mechanism operably coupled to the first face of the backplate; and
the locking mechanism operable to engage the computing component and prevent disengagement from the backplate while the computing component is receiving power.

7. The computing system of claim 1 further comprising:
the data jack operable to receive and transmit data for a plurality of devices operably coupled to the data plug; and
the data plug operable to receive and transmit data for a plurality of devices operably coupled to the at least one data port.

8. The computing system of claim 1 further comprising:
a plurality of data ports operably coupled to the second face of the backplate;
the data ports operable to receive at least one data cable from at least one device; and
the data plug operable to couple the plurality of data ports to the data jack such that the data jack is operably coupled to the at least one device.

9. A computing component comprising:
a housing having one or more devices disposed therein;
the housing having respective top and bottom surfaces, respective front and rear faces, and respective first and second sides;
the first and second sides of the housing operable to engage a pair of guides maintained in a rack structure such that the housing may be guided into and out of an opening of the rack structure;

the rear face of the housing having at least one jack; and the jack operable to couple to a plug on a backplate maintained proximate a rear opening of the rack structure.

10. The computing component of claim 9 further comprising:

at least one processor;

memory operably associated with the processor; and the processor and the memory disposed within the housing.

11. The computing component of claim 9 wherein the jack further comprises a data jack operable to communicate with a plurality of devices operably coupled to the plug on the backplate.

12. The computing component of claim 9 further comprising:

at least one alignment mechanism, operably coupled to the rear face of the housing; and the at least one alignment mechanism operable to engage the backplate such that the jack and the plug may be operably coupled.

13. The computing component of claim 9 further comprising the jack and the plug coupled with each other using a D-type connection.

14. The computing component of claim 9 further comprising the jack and the plug coupled with each other using a card and slot type connection.

15. The computing component of claim 9 further comprising:

at least one power jack operably coupled to the rear face of the housing; and the at least one power jack operable to couple to at least one power supply.

16. The computing component of claim 15 further comprising:

the at least one power jack operable to couple to at least one power plug on the backplate; and the power plug operable to couple to the at least one power supply.

17. A backplate for use with a computer system comprising:

respective first and second faces;

at least one data port operably coupled to the first face;

the at least one data port operable to receive a data cable;

at least one data plug operably coupled to the second face;

the data plug communicatively coupled to the data port; and the data plug operable to communicatively couple to at least one data jack on a rack mountable computing component such that the data cable is operably coupled to the rack mountable computing component.

18. The backplate of claim 17 further comprising:

at least one power port operably coupled to the first face;

the power port operable to receive power from a power supply;

at least one power plug operably coupled to the second face;

the at least one power plug operably coupled to the power port; and the at least one power plug operable to couple with at least one power jack on the rack mountable computing component such that the power supply is electrically coupled to the rack mountable computing component.

19. The backplate of claim 18 further comprising at least one locking mechanism operably coupled to the second face to engage the rack mountable computing component such that the computing component is releasably held in place when receiving power from the power supply.

20. The backplate of claim 17 further comprising:

the at least one data port operable to communicate data to and from a plurality of devices; and the at least one data plug operable to communicate data to and from a plurality of devices.

21. The backplate of claim 17 further comprising:

a plurality of data ports operably coupled to the first face;

the data ports operable to receive a data cable; and the at least one data plug operable to couple each data cable to the at least one data jack.

22. The backplate of claim 17 further comprising:

at least one alignment mechanism operably coupled to the second face; and the at least one alignment mechanism operable to engage the rack mountable computing component such that the data plug and the data jack may be operably coupled.

23. The backplate of claim 17 further comprising:

at least one air pathway; and the air pathway operable to allow air to be circulated with respect to the rack mountable computing component.

* * * * *